(12) United States Patent
Sandhu

(10) Patent No.: US 9,065,047 B2
(45) Date of Patent: Jun. 23, 2015

(54) MIXED VALENT OXIDE MEMORY AND METHOD

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/277,221

(22) Filed: May 14, 2014

(65) Prior Publication Data

US 2014/0248740 A1 Sep. 4, 2014

Related U.S. Application Data

(60) Continuation of application No. 13/915,373, filed on Jun. 11, 2013, now Pat. No. 8,728,899, which is a division of application No. 13/117,323, filed on May 27, 2011, now Pat. No. 8,466,031.

(51) Int. Cl.
*H01L 45/00* (2006.01)

(52) U.S. Cl.
CPC ............ *H01L 45/1608* (2013.01); *H01L 45/04* (2013.01); *H01L 45/1233* (2013.01); *H01L 45/1253* (2013.01); *H01L 45/147* (2013.01); *H01L 45/165* (2013.01)

(58) Field of Classification Search
CPC ..................... H01L 29/7868; G11C 2213/31
See application file for complete search history.

(56) References Cited

U.S. PATENT DOCUMENTS

| | | | |
|---|---|---|---|
| 5,851,948 A * | 12/1998 | Chuang et al. ................ 502/314 |
| 6,746,910 B2 | 6/2004 | Hsu et al. |
| 6,955,992 B2 | 10/2005 | Zhang et al. |
| 7,169,637 B2 | 1/2007 | Zhang et al. |
| 7,186,658 B2 | 3/2007 | Huang et al. |
| 7,741,638 B2 * | 6/2010 | Stewart et al. ................. 257/48 |
| 8,003,511 B2 * | 8/2011 | Rinerson et al. .............. 438/608 |
| 8,466,031 B2 | 6/2013 | Sandhu et al. |
| 8,546,779 B2 * | 10/2013 | Sonehara ........................ 257/2 |
| 8,728,899 B2 | 5/2014 | Sandhu |
| 2006/0171200 A1 | 8/2006 | Rinerson et al. |
| 2010/0159641 A1 | 6/2010 | Rinerson et al. |
| 2012/0302028 A1 | 11/2012 | Sandhu |
| 2013/0273690 A1 | 10/2013 | Sandhu |

* cited by examiner

*Primary Examiner* — Zandra Smith
*Assistant Examiner* — Andre' C Stevenson
(74) *Attorney, Agent, or Firm* — Schwegman Lundberg & Woessner, P.A.

(57) ABSTRACT

Memory devices and methods of forming include a mixed valent oxide located between a first electrode and a second electrode. Implantation of a metal below a surface of one of the electrodes allows formation of the mixed valent oxide with a direct interface to the electrode. An intermetallic oxide can be subsequently formed between the mixed valent oxide and the electrode by annealing the structure.

20 Claims, 3 Drawing Sheets

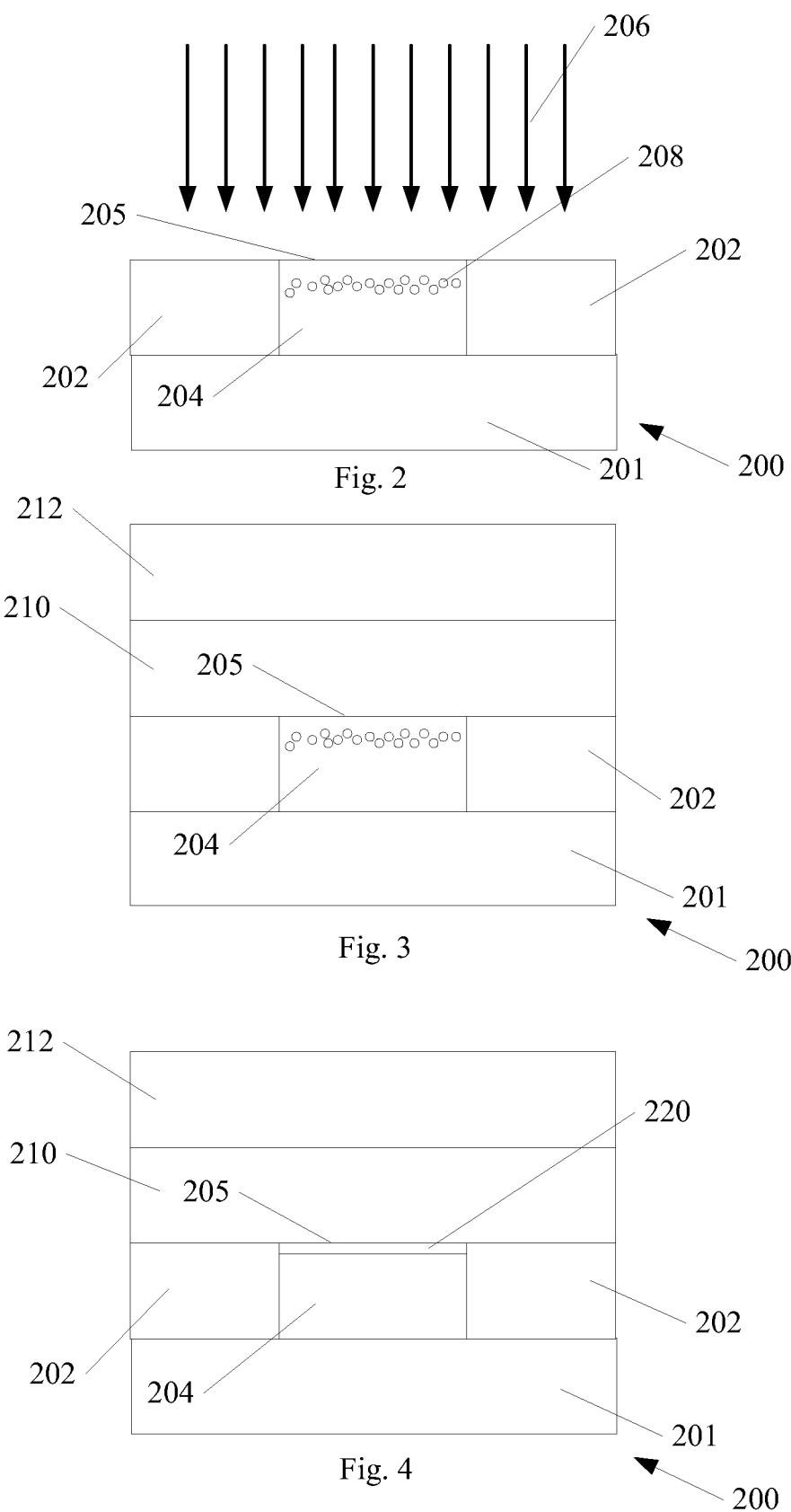

MIXED VALENT OXIDE MEMORY AND METHOD

PRIORITY APPLICATION

This application is a continuation of U.S. application Ser. No. 13/915,373, filed Jun. 11, 2013, which is a divisional of U.S. application Ser. No. 13/117,323, filed May 27, 2011, now issued as U.S. Pat. No. 8,466,031, all of which are incorporated herein by reference in their entirety.

TECHNICAL FIELD

Various embodiments described herein relate to apparatus, systems, and methods associated with semiconductor memories.

BACKGROUND

In semiconductor memories, there is continuous pressure in industry to reduce component dimensions and fit more components in a given amount of chip area. As dimensions shrink, numerous technical hurdles become more significant. Alternative materials are used to provide unique properties necessary to reduce the size of components such as memory cells. The use of alternative materials can present technical hurdles. For example, some alternative materials must be formed under unique processing conditions to create characteristics such as a desired microstructure, a desired stoichiometry, desired electrical properties. Improved memory device configurations and methods are desired to provide improved device operation and ability to operate at smaller scales.

BRIEF DESCRIPTION OF THE DRAWINGS

FIG. 2 shows a substrate in a stage of processing according to an embodiment of the invention.

FIG. 3 shows a substrate in a stage of processing according to an embodiment of the invention.

FIG. 4 shows a substrate in a stage of processing according to an embodiment of the invention.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical, material changes, etc. may be made.

The term "horizontal" as used in this application is defined as a plane parallel to the substrate surface, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the surface being on the top surface of the substrate, regardless of the orientation of the substrate. The following detailed description is, therefore, not to be taken in a limiting sense.

Figure 1:
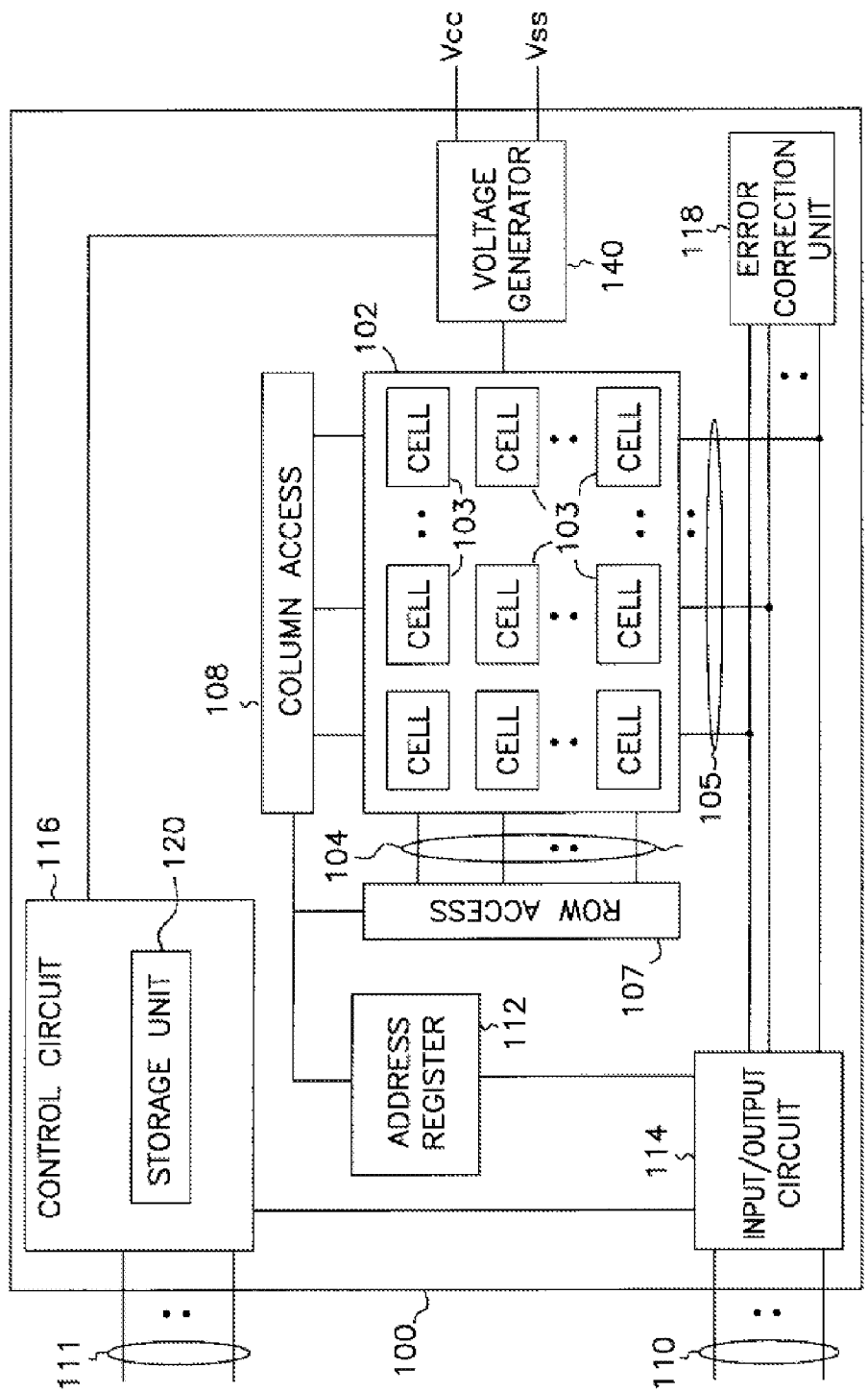
FIG. 1 shows a block diagram of a memory device according to an embodiment of the invention.

FIG. 1 shows a block diagram of a memory device 100 according to an embodiment of the invention. Memory device 100 includes a memory array 102 with memory cells 103 that may be arranged in rows and columns along with access lines 104 and data lines 105. Memory device 100 can use access lines 104 to access memory cells 103 and data lines 105 to transfer information with memory cells 103. Row access 107 and column access circuitry 108 respond to an address register 112 to access memory cells 103 based on row address and column address signals on terminals 110, 111, or both. A data input/output circuit 114 transfers data between memory cells 103 and terminals 110. Terminals 110 and 111 may be external terminals of memory device 100 (e.g., terminals exposed outside a chip or semiconductor package that contains memory device 100).

A control circuit 116 controls operations of memory device 100 based on signals present on terminals 110 and 111. A device (e.g., a processor or a memory controller) external to memory device 100 may send different commands (e.g., write commands and read commands) to memory device 100 using different combinations of signals on terminals 110, 111, or both.

Memory device 100 responds to commands to perform operations such as write (e.g., programming), read, and erase operations. A write operation may store information received at terminals 110 into memory cells 103 (e.g., transfer information from terminals 110 to memory cells 103). A read operation retrieves stored information from memory cells 103 (e.g., transfer information from memory cells 103 to terminals 110). An erase operation erases information (e.g., clears information) from all memory cells 103 or from a selected portion of memory cells 103.

Memory device 100 receives supply voltages Vcc and Vss. Vcc may include a positive voltage value, and Vss may include a ground potential. Memory device 100 can also include a voltage generator 140. Voltage generator 140 and control circuit 116 operate to provide different voltages to memory array 102 or to cause memory array 102 to receive different voltages during the operations (e.g., write and read operations) of memory device 100.

Memory device 100 may include an error correction unit 118 to check for errors in information retrieved from memory cells 103. Error correction unit 118 may include error correction circuitry to correct errors based on an error correction code (ECC), as is well-known to those of ordinary skill in the art.

Memory device 100 may include a storage unit 120, which may include circuit components such as registers. Storage unit 120 may include a hardware portion, a firmware portion, or both, of memory device 100. Storage unit 120 may also be used to store codes (e.g., software programming instructions).

Memory device 100 can be a flash memory device such as a NAND flash or a NOR flash memory device, a resistive random access memory (RRAM) device, a phase change memory device, and other kinds of memory devices.

Memory device 100 can be a single-level-cell memory device such that memory cells 103 can include memory element to store information to represent a value of a single bit of information. For example, memory cells 103 may store information that represents either a binary "0" value or a binary "1" value of a single bit of information.

Memory device 100 can be a multi-level-cell (MLC) memory device such that each of memory cells 103 can include memory element to store information represented by a value corresponding to multiple bits of information (e.g., a value corresponding to two, three, four, or some other number of bits of information). For example, when each of memory cells 103 corresponds to a 2-bit per cell, each of memory cells 103 may store information to represent a value corresponding to one of four possible combinations of two binary bits of information (i.e., combination 00, 01, 10, and 11 corresponding to two bits of information).

Single level and MLC memory devices may be combined within memory device 100. One of ordinary skill in the art will readily recognize that memory device 100 can include other parts, which are omitted from FIG. 1 to help focus on the various embodiments described herein. Memory device 100 may include structures formed by one or more of the embodiments described below with reference to FIG. 2 through FIG. 4.

FIG. 2 shows a substrate 200. In one example, the substrate 200 includes a base portion 201. Examples of base portion 201 may include silicon, germanium, gallium arsenide, or other semiconductor materials. Other examples of base portion 201 may include composite structures such as silicon on insulator structures.

An electrode 204 is shown located over the base portion 201. The electrode is located within a dielectric material 202. As an example, the electrode 204 includes a platinum electrode. Platinum provides chemical and structural properties that encourage nucleation and growth of subsequent structures, as explained in more detail below. Other electrode materials may include, other noble metals, other refractory metals, alloys of platinum, alloys of other noble metals, and/ or alloys of other refractory metals. Examples of dielectric materials 202 include silicon oxide, other oxides, or other electrically insulating materials.

In FIG. 2, energetic species 206 are shown implanting metal ions 208 below a surface 205 of the electrode 204. In one example, the metal ions include a single species, however, two or more species are contemplated. Some example single species metal ions include zirconium, aluminum, titanium, tantalum, or hafnium. The species of metal ions are chosen to later form an intermetallic oxide, as described in more detail below. In one example, both zirconium and hafnium are implanted at the same time to later form a zirconium hafnium oxide. Zirconium and hafnium are only used as example metal ions, to illustrate the method. Other metal species may be used to form other desired intermetallic oxides, depending on the material properties of the resulting intermetallic oxide desired. Desired intermetallic oxide properties may include dielectric constant, microstructure, compatibility with adjacent materials, etc.

In one example the energetic species 206 include processes other than ion implantation to place metal ions 208 below the surface 205 of the electrode 204. For example, the energetic species 206 includes gas cluster ion bombardment (GCIB) or plasma implantation.

In one example, the energetic species 206 include both metal ions and oxygen ions. In later processing operations, the implanted oxygen ions combine with the implanted metal ions to form an intermetallic oxide.

FIG. 3 shows formation of a mixed valent oxide 210 over the electrode 204. Examples of mixed valent oxides 210 include any of several magnetite perovskite oxide materials that exhibit resistive switching behavior. For example, praseodymium calcium manganese oxide (PrCaMnO), or lanthanum calcium manganese oxide (LaCaMnO).

FIG. 3 also shows a top electrode 212 formed over the mixed valent oxide 210. In operation as a memory cell, a resistive state, corresponding to stored data, is stored in the mixed valent oxides 210. When a potential is placed between the electrode 204, and the top electrode 212, if the resistive state of the mixed valent oxides 210 is relatively low, a current will conduct between the electrode 204 and the top electrode 212, indicating a stored state.

Formation of mixed valent oxide 210 can be technically challenging. It has been discovered that mixed valent oxide 210 formation is facilitated by a direct interface with platinum or a similar metal, as listed above. Because the metal ions 208 are implanted below the surface 205 of the electrode, the mixed valent oxide 210 can form a direct interface with the electrode 204 during deposition. In one example, the mixed valent oxide 210 is substantially crystalline, and the platinum or a similar metal, as listed above, promotes crystallinity in formation of the mixed valent oxide 210.

In FIG. 4, the device has been annealed. The anneal temperature is sufficient to drive the metal ions 208 from beneath the surface 205 of the electrode 204, up to the surface 205, which forms an interface between the mixed valent oxide 210 and the electrode 204. One example of an anneal procedure includes a temperature in a range of approximately 200-700° C. In another example, the temperature is in a range of approximately 300-500° C. One example of an anneal procedure includes holding an anneal temperature for a time in a range of approximately 10-60 minutes. In another example, the anneal temperature is held for approximately 15-30 minutes.

In one example, the metal ions 208 react with oxygen from the mixed valent oxide 210 to form an intermetallic oxide 220. In examples where both oxygen and metal ions were implanted in FIG. 1, at least a portion of the implanted oxygen combines with the metal ions 208 to form the intermetallic oxide 220. Embodiments using implanted oxygen in addition to implanted metal ions 208 can adjust the oxygen content within the intermetallic oxide 220 by adjusting variables such as the amount of oxygen implanted, the depth of implant, and the ratio of oxygen to metal ions 208.

In addition to forming the intermetallic oxide, the anneal operation may further promote crystalline growth of the mixed valent oxide 210.

Figure 5:
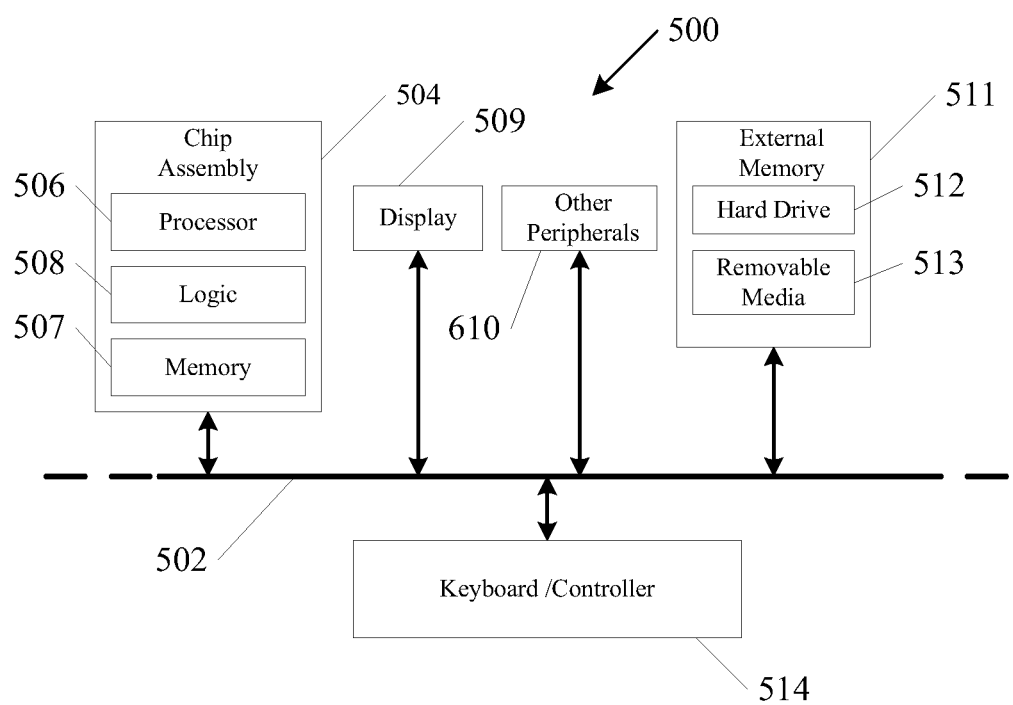
FIG. 5 shows an information handling system, utilizing structures formed according to an embodiment of the invention.

An embodiment of an information handling system such as a computer is included in FIG. 5 to show an embodiment of a high-level device application. FIG. 5 is a block diagram of an information handling system 500 incorporating a substrate such as a chip or chip assembly 504 that includes a mixed valent oxide memory cell according to an embodiment of the invention. The information handling system 500 shown in FIG. 5 is merely one example of a system in which the present invention can be used. Other examples include, but are not limited to, personal data assistants (PDAs), cellular telephones, MP3 players, aircraft, satellites, military vehicles, etc.

In this example, information handling system 500 comprises a data processing system that includes a system bus 502 to couple the various components of the system. System bus 502 provides communications links among the various components of the information handling system 500 and may be implemented as a single bus, as a combination of busses, or in any other suitable manner.

Chip assembly 504 is coupled to the system bus 502. Chip assembly 504 may include any circuit or operably compatible combination of circuits. In one embodiment, chip assembly 504 includes a processor 506 that can be of any type. As used herein, "processor" means any type of computational circuit such as, but not limited to, a microprocessor, a microcontroller, a graphics processor, a digital signal processor (DSP), or any other type of processor or processing circuit or cores thereof. Multiple processors such as "multi-core" devices are also within the scope of the invention.

In one embodiment, a memory device 507, is included in the chip assembly 504. Those skilled in the art will recognize that a wide variety of memory device configurations may be used in the chip assembly 504. Acceptable types of memory chips include, but are not limited to, Dynamic Random Access Memory (DRAMs) such as SDRAMs, SLDRAMs, RDRAMs and other DRAMs. Memory chip 507 can also include non-volatile memory such as NAND memory or NOR memory.

In one embodiment, additional logic chips 508 other than processor chips are included in the chip assembly 504. An example of a logic chip 508 other than a processor includes an analog to digital converter. Other circuits on logic chips 508 such as custom circuits, an application-specific integrated circuit (ASIC), etc. are also included in one embodiment of the invention.

Information handling system 500 may also include an external memory 511, which can include one or more memory elements, such as one or more hard drives 512, and/or one or more drives that handle removable media 513 such as floppy diskettes, compact disks (CDs), digital video disks (DVDs), and the like.

Information handling system 500 may also include a display device 509 such as a monitor, additional peripheral components 510, such as speakers, etc. and a keyboard and/or controller 514, which can include a mouse, or any other device that permits a system user to input data into and receive data from the information handling system 500.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of embodiments of the present invention. It is to be understood that the above description is intended to be illustrative and not restrictive. Combinations of the above embodiments, and other embodiments, will be apparent to those of skill in the art upon studying the above description.

What is claimed is:

1. A method, comprising:
   implanting metal ions below a surface of a platinum electrode;
   implanting oxygen below the surface of the platinum electrode;
   forming a mixed valent oxide using the platinum electrode as a seed layer;
   annealing to move the metal ions and oxygen from below the surface of the platinum electrode to an interface between the mixed valent oxide and the platinum electrode; and
   combining the metal ions and the implanted oxygen to form an intermetallic oxide at the interface.

2. The method of claim 1, wherein implanting metal ions includes implanting one or more ions chosen from a group consisting of zirconium, aluminum, titanium, tantalum and hafnium.

3. The method of claim 1, wherein implanting metal ions includes implanting both zirconium and hafnium.

4. The method of claim 1, further including adjusting an oxygen content in the intermetallic oxide by selecting an amount of implanted oxygen.

5. The method of claim 1, further including forming a second electrode over the mixed valent oxide to form a memory cell.

6. A method, comprising:
   implanting metal ions below a surface of a platinum electrode;
   implanting oxygen below the surface of the platinum electrode;
   forming a substantially crystalline mixed valent oxide using the platinum electrode as a seed layer;
   annealing to move the metal ions and oxygen from below the surface of the platinum electrode to an interface between the mixed valent oxide and the platinum electrode; and
   combining the metal ions and the implanted oxygen to form an intermetallic oxide at the interface.

7. The method of claim 6, further including adjusting an oxygen content in the intermetallic oxide by selecting an amount of implanted oxygen.

8. The method of claim 6, further including selecting anneal process conditions to further promote crystallinity in the mixed valent oxide.

9. The method of claim 6, wherein annealing includes annealing at a temperature is a range of approximately 200-700° C.

10. The method of claim 6, wherein annealing includes annealing at a temperature is a range of approximately 300-500° C.

11. The method of claim 6, wherein annealing includes annealing for approximately 10-60 minutes.

12. The method of claim 6, wherein annealing includes annealing for approximately 15-30 minutes.

13. The method of claim 6, further including forming a second electrode over the mixed valent oxide to form a memory cell.

14. A method, comprising:
   implanting metal ions below a surface of an electrode;
   implanting oxygen below the surface of the electrode;
   forming a magnetite perovskite oxide using the platinum electrode as a seed layer;
   annealing to move the metal ions and oxygen from below the surface of the electrode to an interface between the magnetite perovskite oxide and the electrode; and
   combining the metal ions and the implanted oxygen to form an intermetallic oxide at the interface.

15. The method of claim 14, wherein forming a magnetite perovskite oxide includes forming a praseodymium calcium manganese oxide (PrCaMnO).

16. The method of claim 14, wherein forming a magnetite perovskite oxide includes forming a lanthanum calcium manganese oxide (LaCaMnO).

17. The method of claim 14, wherein implanting metal ions below a surface of an electrode includes implanting metal ions below a surface of a noble metal electrode.

18. The method of claim 14, wherein implanting metal ions below a surface of an electrode includes implanting metal ions below a surface of a platinum electrode.

19. The method of claim 14, wherein implanting metal ions below a surface of an electrode includes implanting metal ions below a surface of a refractory metal electrode.

20. The method of claim 14, further including forming a second electrode over the substantially crystalline magnetite perovskite oxide to form a memory cell.

* * * * *